United States Patent
Kim et al.

(10) Patent No.: US 8,269,401 B1
(45) Date of Patent: Sep. 18, 2012

(54) GRAPHENE POWER-MILL SYSTEM

(75) Inventors: Ki Il Kim, Los Angeles, CA (US); Sang Woo Kim, Suwon (KR); Young Kim, Los Angeles, CA (US)

(73) Assignee: K-Technology, Inc., Pico Rivera, CA (US)

( * ) Notice: Subject to any disclaimer, the term of this patent is extended or adjusted under 35 U.S.C. 154(b) by 0 days.

(21) Appl. No.: 13/305,641

(22) Filed: Nov. 28, 2011

(51) Int. Cl.
*H01L 41/113* (2006.01)
(52) U.S. Cl. .................................. 310/339; 310/800
(58) Field of Classification Search ............. 310/339, 310/800
See application file for complete search history.

(56) References Cited

U.S. PATENT DOCUMENTS

| | | | |
|---|---|---|---|
| 5,034,648 A * | 7/1991 | Gastgeb | 310/330 |
| 2008/0083139 A1 * | 4/2008 | Mullen | 36/136 |
| 2008/0213529 A1 * | 9/2008 | Gray et al. | 428/44 |
| 2010/0097292 A1 * | 4/2010 | Peczalski | 343/904 |
| 2010/0171393 A1 * | 7/2010 | Pei et al. | 310/330 |

* cited by examiner

*Primary Examiner* — Derek Rosenau
(74) *Attorney, Agent, or Firm* — John K. Park; Park Law Firm

(57) ABSTRACT

A graphene power-mill system is provided, including a graphene sheet configured for generating electrical charges on both sides, a graphene sheet holder configured for engaging and holding the graphene sheet on a first side, a groove provided on the first side of the graphene sheet holder, and a graphene pusher or bender configured for pushing and releasing a portion of the graphene sheet into the groove. the graphene pusher or bender has a shape fitting the groove, and the graphene sheet recovers to be flat after removing the graphene pusher or bender from the groove. The graphene sheet can comprise graphene layers and one or more polyvinylidene fluoride (PVDF) layers stacked alternatingly. Both sides of the stacked graphene layers can be connected in parallel electrically.

16 Claims, 7 Drawing Sheets

GRAPHENE POWER-MILL SYSTEM

BACKGROUND OF THE INVENTION

The present invention relates to a graphene power-mill system.

Our everyday life is full of energy, which can be harvested. Such energy can be found almost everywhere. Wherever there are mechanical movements, some forms of energy are wasted.

Many people tried to harvest such energy, but they could not obtain reasonably good results.

Accordingly, a need for a graphene power-mill system has been present for a long time. This invention is directed to solve these problems and satisfy the long-felt need.

SUMMARY OF THE INVENTION

The present invention contrives to solve the disadvantages of the prior art.

An object of the invention is to provide a graphene power-mill system.

The graphene power-mill system comprises:
a graphene sheet configured for generating electrical charges on both sides thereof;
a graphene sheet holder configured for engaging and holding the graphene sheet on a first side, wherein the graphene sheet holder comprises insulator;
a groove provided on the first side of the graphene sheet holder; and
a graphene pusher or bender configured for pushing and releasing a portion of the graphene sheet into the groove,
wherein the graphene pusher or bender has a shape fitting the groove,
wherein the graphene sheet recovers to be flat after removing the graphene pusher or bender from the groove.

The graphene sheet may comprise one or more graphene layers and one or more polyvinylidene fluoride (PVDF) layers stacked alternatingly.

Both sides of the stacked graphene layers may be connected in parallel.

The graphene sheet may comprise a graphene layer and a PVDF layer.

The graphene sheet may comprise 20 graphene layers and 20 PVDF layers.

The graphene sheet holder may be made of plastic.

The groove may have a V shape. The groove may have a shape of cone. The groove may have a shape of extended V-cut across the graphene sheet holder.

Alternatively, the groove may have a U shape.

The groove may have a shape of hemisphere.

The groove may have a shape of extended U-cut across the graphene sheet holder.

The graphene pusher or bender may be configured to be powered by an external force of human power, wind power, water power, or electrical/mechanical power.

The graphene pusher or bender may be connected to a driver.

The driver may be installed such that the graphene pusher or bender is aligned with the groove in pushing and releasing.

The graphene power-mill system may further comprise:
a second graphene sheet configured for generating electrical charges on both sides thereof;
a second graphene sheet holder configured for engaging and holding the second graphene sheet on a first side thereof, wherein the second graphene sheet holder comprises insulator;
a second groove provided on the first side of the second graphene sheet holder; and
a second graphene pusher or bender configured for pushing and releasing a portion of the second graphene sheet into the second groove,
wherein the second graphene pusher or bender has a shape fitting the second groove,
wherein the second graphene sheet recovers to be flat after removing the second graphene pusher or bender from the second groove.

The second graphene sheet may be disposed so as to face the graphene sheet.

The second graphene pusher or bender may be aligned with the graphene pusher or bender, and the graphene pusher or bender and the second graphene pusher or bender may be connected to a driver installed such that each graphene pusher or bender is aligned with corresponding groove in pushing and releasing.

The groove may have a V shape and the second groove has a U shape.

Each graphene sheet may be attached to corresponding graphene sheet holder such that a portion above corresponding groove is pushed in and released from the groove freely.

The graphene pusher or graphene bender may be connected to a cover sheet disposed over the graphene sheet, such that the cover sheet is configured to be trodden on by feet or run over by automobiles.

The advantages of the present invention are: (1) the graphene power-mill system is easy to manufacture; (2) the graphene power-mill system is easy to install and maintain; and (3) the graphene power-mill system harvests energy otherwise wasted.

Although the present invention is briefly summarized, the fuller understanding of the invention can be obtained by the following drawings, detailed description and appended claims.

BRIEF DESCRIPTION OF THE DRAWINGS

These and other features, aspects and advantages of the present invention will become better understood with reference to the accompanying drawings, wherein.

DETAILED DESCRIPTION EMBODIMENTS OF THE INVENTION

Figure 1:
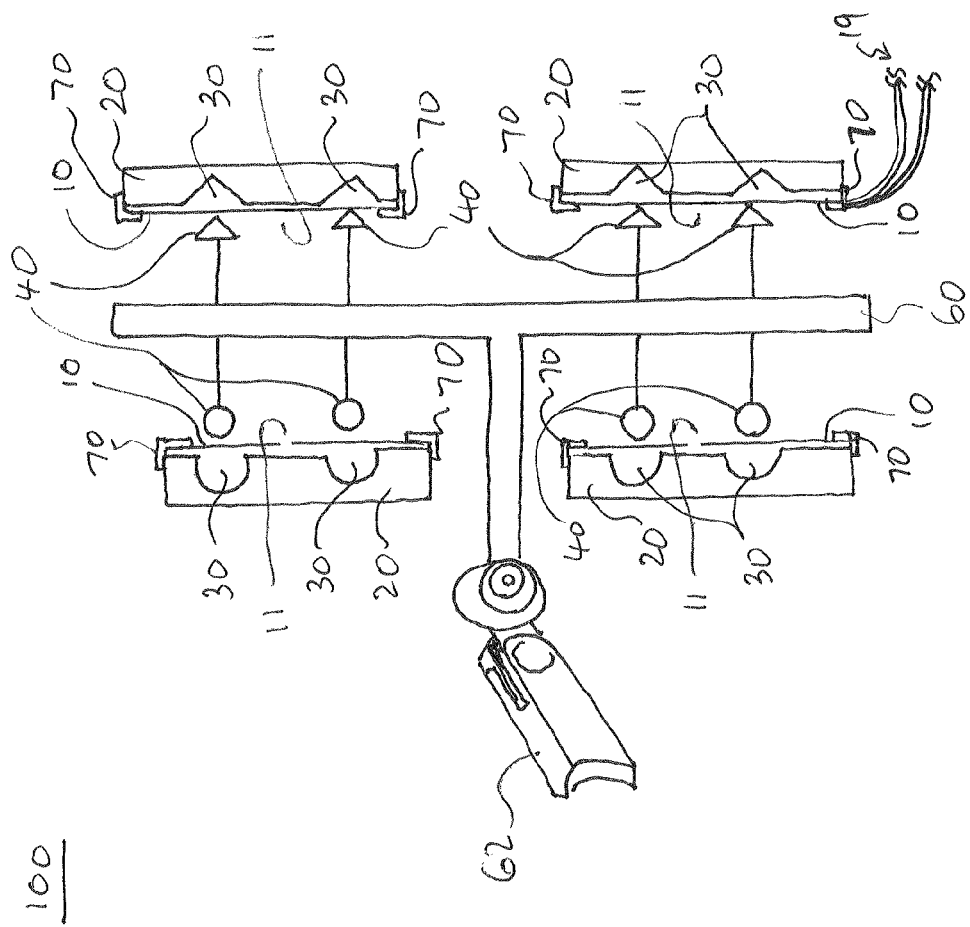
FIG. 1 is a perspective view showing a graphene power-mill system according to an embodiment of the present invention.
Figure 2:
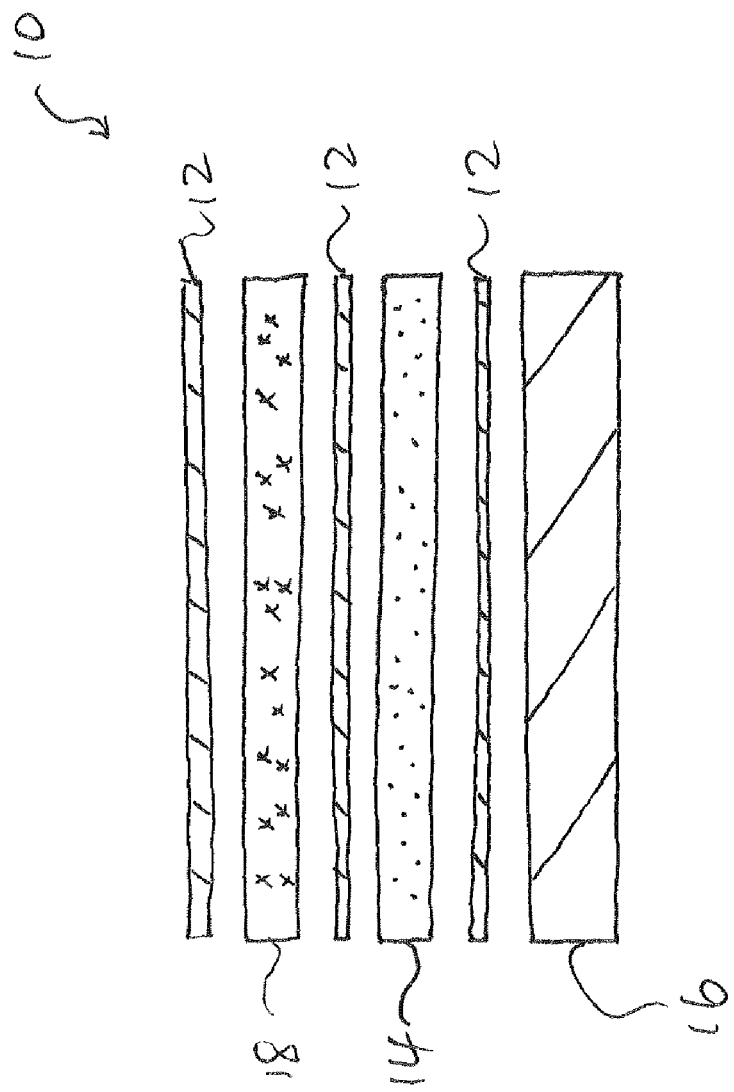
FIG. 2 is a cross-sectional view showing a graphene sheet according to another embodiment of the present invention.

FIGS. 1 and 2 show a graphene power-mill system 100 according to an embodiment of the invention.

Figure 3:
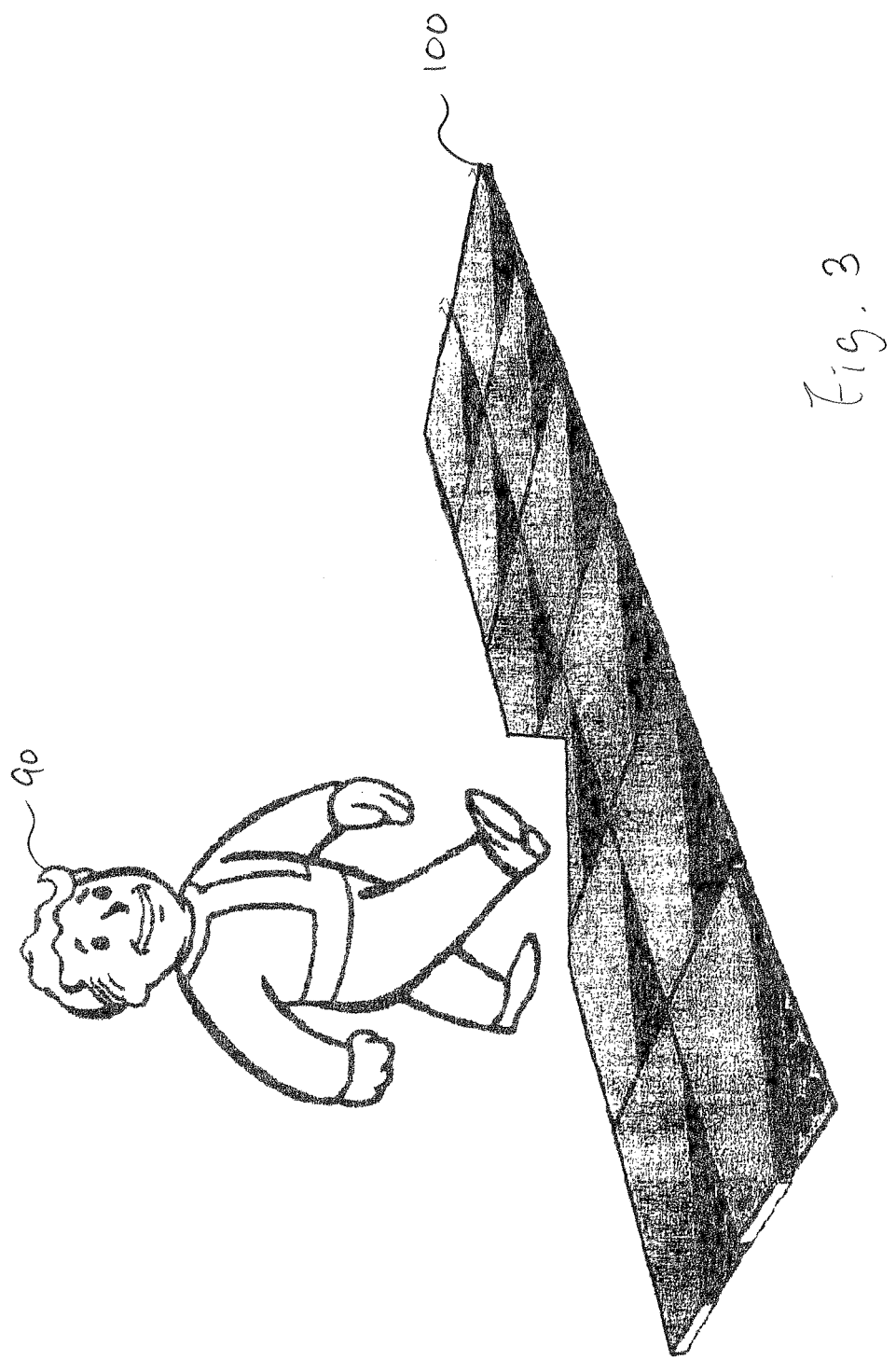
FIG. 3 is a perspective view showing an example of powering a graphene power-mill system according to still another embodiment of the invention.
Figure 4:
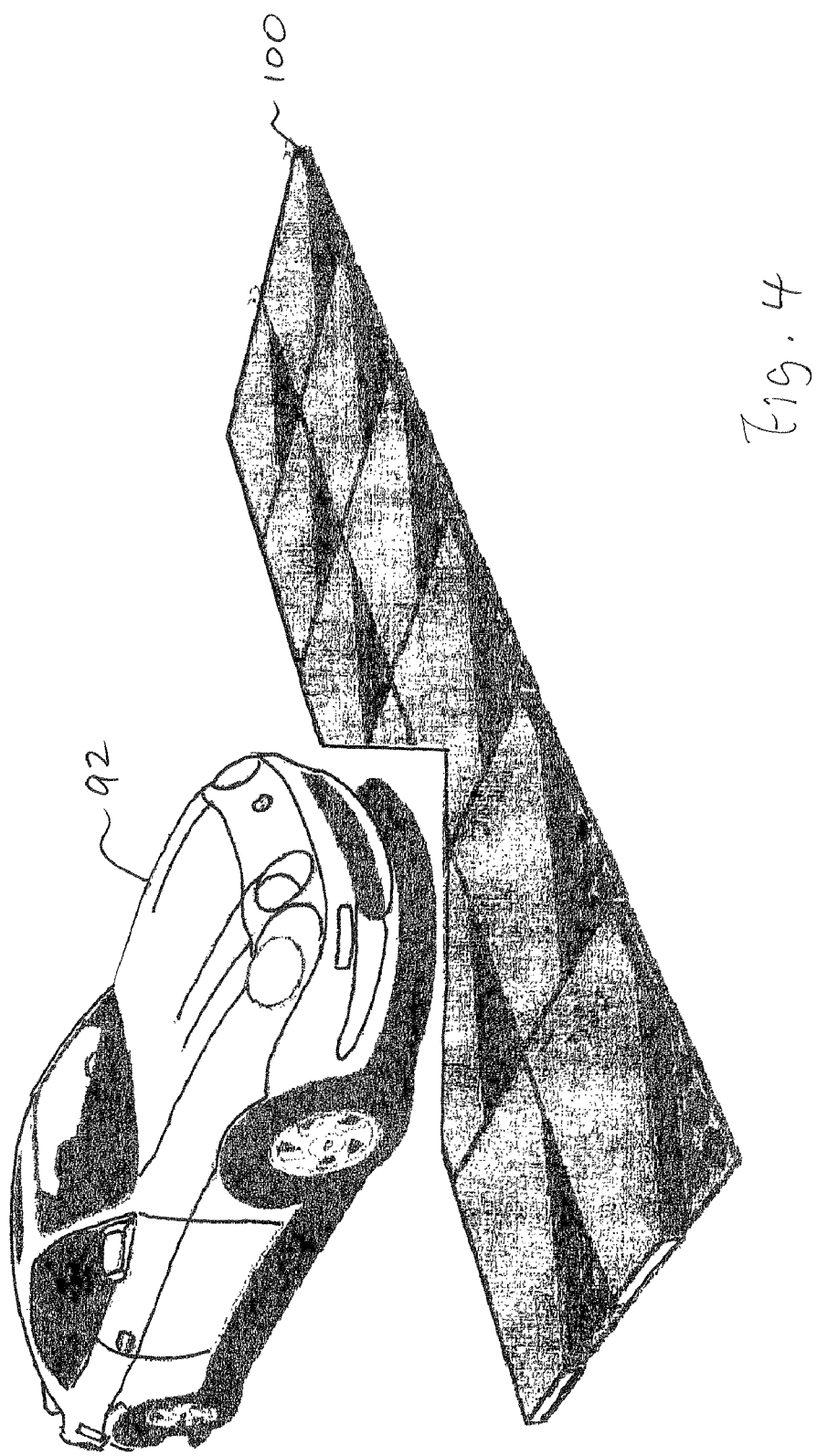
FIG. 4 is a perspective view showing an example of powering a graphene power-mill system according to still another embodiment of the invention.

FIGS. 3 and 4 show how to power the graphene power-mill system 100.

Figure 5:
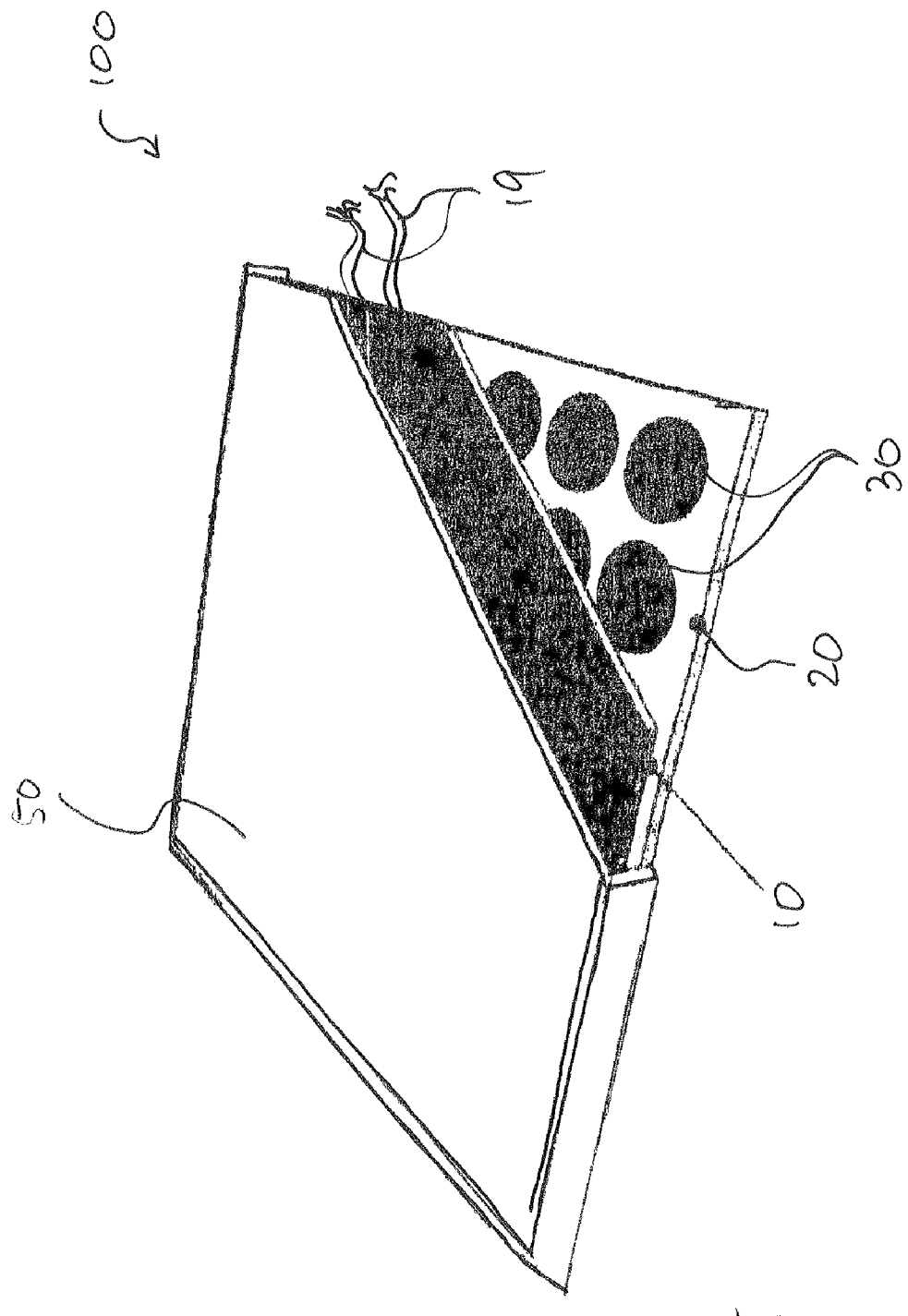
FIG. 5 is a perspective partial cross-sectional view showing a graphene sheet according to still another embodiment of the invention.
Figure 6:
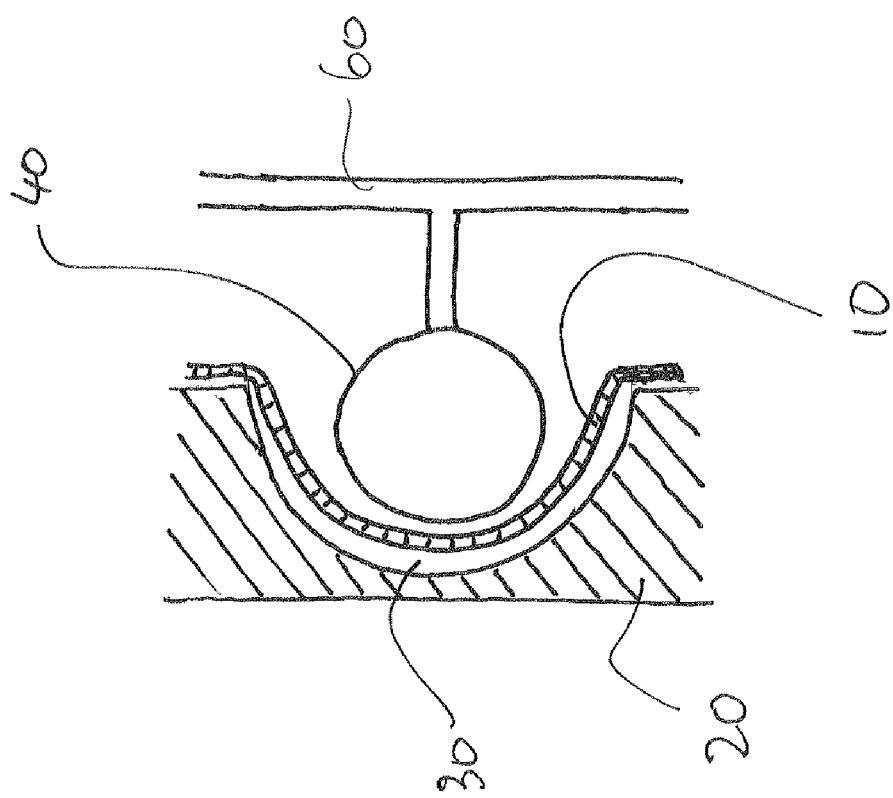
FIG. 6 is a cross-sectional view showing a graphene pusher or bender pushing into a groove according to still another embodiment of the invention.

FIGS. 5 and 6 show another view of the graphene power-mill system 100 according to another embodiment of the invention.

An aspect of the invention provides a graphene power-mill system 100.

The graphene power-mill system 100 comprises a graphene sheet 10, a graphene sheet holder 20, a groove 30, and a graphene pusher or bender 40.

The graphene sheet 10 is configured for generating electrical charges on both sides thereof. The graphene sheet 10 is configured to generate electrical charges through the well-known piezoelectricity. Graphene is thin but strong enough to withstand repeated deformations.

The graphene sheet holder 20 is configured for engaging and holding the graphene sheet 10 on a first side of the graphene sheet holder 20, and the graphene sheet holder 20 comprises insulator. The graphene sheet holder 20 holds and supports the graphene sheet 10 and provides an insulation to keep the piezoelectric charges generated on the side surfaces of the graphene sheet 10.

The groove 30 is provided on the first side of the graphene sheet holder 20. The groove 30 can have any shape such that the graphene sheet 10 can be pushed into and change its own shape for generating the piezoelectricity.

The graphene pusher or bender 40 is configured for pushing and releasing a portion of the graphene sheet 10 into the groove 30.

The graphene pusher or bender 40 has a shape fitting the groove 30, such that the graphene sheet 30 may be pushed by the pusher 40 and deformed into a shape of the groove 30, still not receiving any further strain on itself.

The graphene sheet 10 is resilient enough and recovers a flat shape after removing the graphene pusher or bender 40 from the groove 30. The graphene pusher or bender 40 may include one or more spring (not shown) for itself. Thus, with an external force applied thereto, the pusher 40 pushes the portion of the graphene sheet 10 into the groove 30, and as soon as the external force is removed the pusher 40 would be retreated from the groove 30 making the graphene sheet 10 recover its original flat shape.

The graphene sheet 10 comprises one or more graphene layers 12 and one or more polyvinylidene fluoride (PVDF) layers 14 stacked alternatingly, and one or more Polydimethylsiloxane (PDMS) insulating layers 18 for insulating graphene layers, and wherein both sides of the stacked graphene layers 12 are connected in parallel.

The thickness of the PVDF layer 14 may be about 2 μm. In certain embodiment of the invention, the graphene sheet 10 may comprise a plastic substrate 16 at one end of the stacks as shown in FIG. 2.

Both sides of the stacked graphene layers 12 may be connected in parallel electrically. Thus, a desired amount of electric current may be obtained.

The dimension of the graphene sheet 10 may be determined according to the desired usage. The area of the graphene sheet 10 may be increased as the usage requires or the environment allows.

Therefore, the simplest graphene sheet 10 may includes a PVDF layer 14 sandwiched between two graphene layers 12 and a plastic substrate 16. To the above, another PVDF layer 14 sandwiched between another two graphene layers 12 can be stacked on top of the previous structure with a PDMS layer inbetween for insulation.

The graphene sheet 10 may comprise a graphene layer 12 and a PVDF layer 14. Or, if necessary, the number of stacking layers 12, 14 can be increased. For example, the graphene sheet 10 may comprise, for example, twenty graphene layers 12 and, for example, twenty PVDF layers 14, or more.

The graphene sheet holder 20 may be made of, but not limited to, plastic. The graphene sheet holder 20 should be insulating. Additionally, it must satisfy other mechanical requirements for supporting the graphene sheet 10 in place.

The groove 30 may have any shape as long as it can give some deformation to the graphene sheet 10. The groove 30 may have a V shape for a cross-section. The groove 30 may have a shape of cone in three dimension. The groove 30 may have a shape of extended V-cut across the graphene sheet holder 20.

Alternatively, the groove 30 may have a U shape for a cross-section.

The groove 30 may have a shape of hemisphere in three dimension.

The groove 30 may have a shape of extended U-cut across the graphene sheet holder 20.

The graphene pusher or bender 40 may be configured to be powered by an external force of human power, wind power, water power, or electrical/mechanical power.

The graphene pusher or bender 40 may be connected to a driver 60.

The driver 60 may be installed such that the graphene pusher or bender 40 is aligned with the groove 30 in pushing and releasing.

In certain embodiments, the driver 60 may include a plate having the same dimension as the graphene sheet 10.

In another aspect of the invention as shown in FIG. 1, the graphene power-mill system 100 may further comprise:

a second graphene sheet 10 configured for generating electrical charges on both sides thereof;

a second graphene sheet holder 20 configured for engaging and holding the second graphene sheet 10 on a first side thereof, wherein the second graphene sheet holder 20 comprises insulator;

a second groove 30 provided on the first side of the second graphene sheet holder 20; and a second graphene pusher or bender 40 configured for pushing and releasing a portion of the second graphene sheet 10 into the second groove 30, wherein the second graphene pusher or bender 40 has a shape fitting the second groove 30, wherein the second graphene sheet 10 recovers to be flat after removing the second graphene pusher or bender 40 from the second groove 30.

The above structure may be efficient especially when the driving force on the driver 60 is oscillating back and forth.

The second graphene sheet 10 may be disposed so as to face the graphene sheet 10.

The second graphene pusher or bender 40 may be aligned with the graphene pusher or bender 40, and the graphene pusher or bender 40 and the second graphene pusher or bender 40 may be connected to a driver 60 installed such that each graphene pusher or bender 40 is aligned with corresponding groove 30 in pushing and releasing as shown in FIG. 2.

The groove 30 may have a V shape and the second groove 30 has a U shape.

Each graphene sheet 10 may be attached to corresponding graphene sheet holder 20 such that a portion above corresponding groove 30 is pushed in and released from the groove 30 freely.

In certain embodiments of the invention, the graphene power-mill system 100 may further comprise a battery (not shown) for storing the generated electricity. Of course, the battery is connected to the graphene sheet 10 to collect the piezoelectric charges through wires 19 as shown in FIG. 5.

Figure 7:
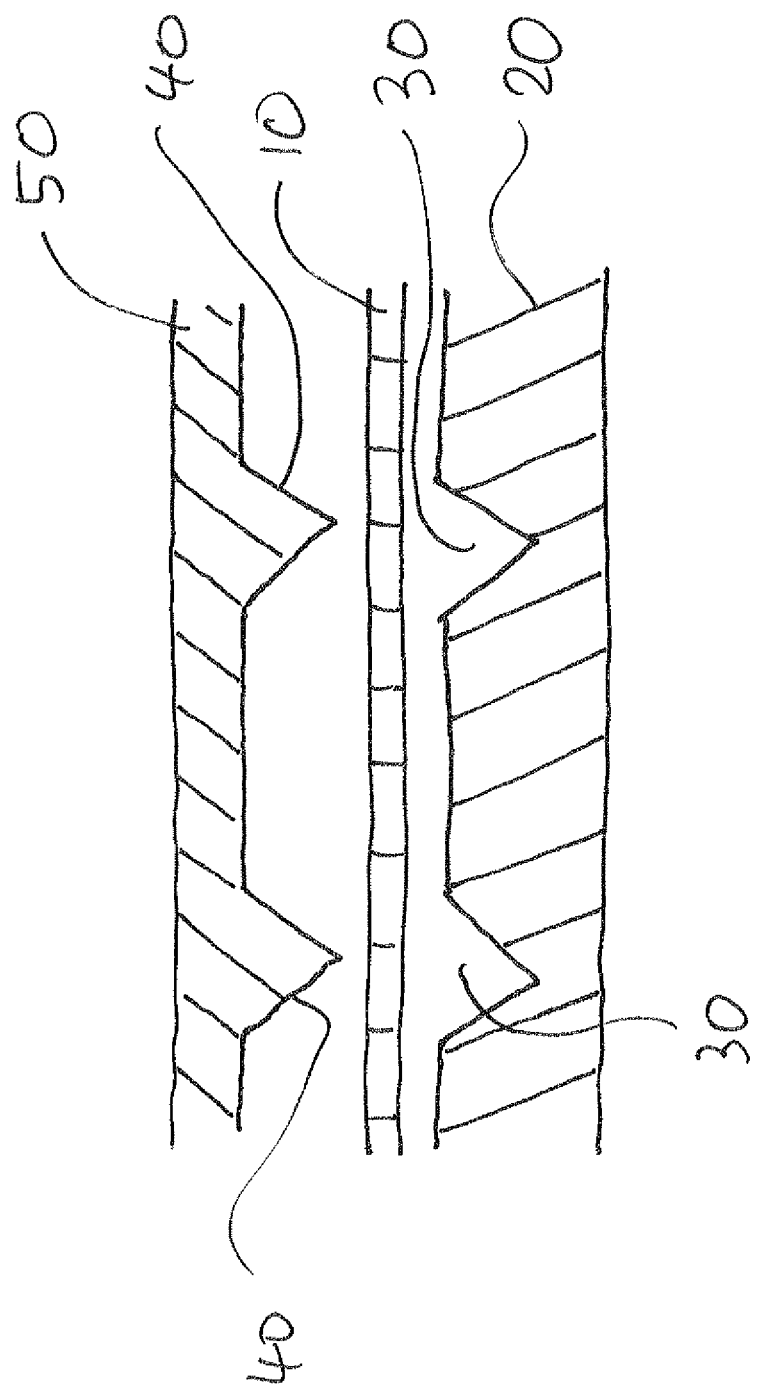
FIG. 7 is a cross-sectional view showing a graphene power-mill system according to still another embodiment of the invention.

In certain embodiments of the invention, the graphene pusher or graphene bender 40 may be connected to a cover sheet 50 disposed over the graphene sheet 10, such that the cover sheet 50 is configured to be trodden on by feet or run over by automobiles as shown in FIGS. 3, 4, and 7.

According to another aspect of the invention, a method for manufacturing graphene power-mill system is provided, in which the graphene sheet is made flat, and the graphene sheet comprises a graphene layer and a PVDF layer or a plastic layer or a PDMS layer.

In FIG. 1, the graphene power-mill system 100 may further comprise a fastener 70 which fastens the graphene sheet 10 to the graphene sheet holder 20. The driver 60 may be connected to, for example, a mechanical arm 62. The graphene sheet 10 may further comprise a plurality of slits 11, which prevent the graphene sheet 10 from being rent while being pushed or bent.

In FIG. 2, the layers are put together through means such as glue (not shown). And, the graphene layers 12 are connected electrically in parallel for harvesting the piezoelectricity. The PDMS polymer layer 18 is for insulating the graphene layers 12.

In FIGS. 3 and 4, a person 90 or a car 92 is just an example of powering the graphene power-mill system 100. The graphene power-mill systems 100 include the cover sheet 50 as shown in FIG. 7.

In FIG. 5, the cover sheet 50 is configured to cover all the other parts of the graphene power-mill systems 100.

In FIG. 6, the graphene pusher or graphene bender 40 is described as a ball shape, which corresponds to the shape of the groove 30. Of course, the round shape is not the only possible shape as described in the above.

In FIG. 7, the cover sheet 50 is integrated with the graphene pusher or graphene bender 40.

Some of piezoelectric elements were disclosed in U.S. Pat. No. 7,239,066, U.S. Pat. No. 7,511,404, and U.S. Pat. No. 4,316,413. It is well known that a direct pressure type piezoelectric element and a vibration type piezoelectric element.

Graphene is very reliable and resilient, so as to recover its original shape after folding in half, and has a high conductivity, a light weight, and is very economic material.

The graphene/PVDF elements has a long life, a high strength, a 100 times higher conductivity than copper, and flexibility. The material is cheaper than ceramic and the supply is affluent.

While the invention has been shown and described with reference to different embodiments thereof, it will be appreciated by those skilled in the art that variations in form, detail, compositions and operation may be made without departing from the spirit and scope of the invention as defined by the accompanying claims.

What is claimed is:

1. A graphene power-mill system comprising:
   a graphene sheet configured for producing electricity on one or both sides thereof;
   a graphene sheet holder configured for engaging and holding the graphene sheet on a first or second side, wherein the graphene sheet holder comprises an insulator, wherein the graphene sheet holder is attached to an object; and
   a graphene pusher or graphene bender configured for pushing, bending, and releasing a portion of the graphene sheet,
   further comprising a groove provided on the first side of the graphene sheet holder, wherein the graphene pusher or graphene bender is configured for pushing and releasing a portion of the graphene sheet into the groove, and wherein the graphene pusher or bender has a shape fitting the groove, wherein the graphene sheet recovers to be flat after removing the graphene pusher or bender from the groove, so as to reproduce electricity,
   wherein the graphene sheet comprises one or more graphene layers and one or more polyvinylidene fluoride (PVDF) layers stacked alternatingly, and one or more Polydimethylsiloxane (PDMS) insulating layers for insulating graphene layers, and wherein both sides of the stacked graphene layers are connected in parallel.

2. The graphene power-mill system of claim 1, wherein the graphene sheet comprises a graphene layer and a PVDF layer or a plastic layer.

3. The graphene power-mill system of claim 2, wherein the graphene sheet comprises 20 graphene layers and 20 PVDF layers.

4. The graphene power-mill system of claim 1, wherein the graphene sheet holder is made of plastic.

5. The graphene power-mill system of claim 1, wherein the groove has a V shape.

6. The graphene power-mill system of claim 5, wherein the groove has a shape of cone.

7. The graphene power-mill system of claim 5, wherein the groove has a shape of extended V-cut across the graphene sheet holder.

8. The graphene power-mill system of claim 1, wherein the groove has a U shape.

9. The graphene power-mill system of claim 8, wherein the groove has a shape of hemisphere.

10. The graphene power-mill system of claim 8, wherein the groove has a shape of extended U-cut across the graphene sheet holder.

11. The graphene power-mill system of claim 1, wherein the graphene pusher or bender is configured to be powered by an external force of human power, wind power, water power, or electrical/mechanical power, wherein the graphene pusher or bender is connected to a driver, and wherein the driver is installed such that the graphene pusher or bender is aligned with the groove in pushing and releasing.

12. The graphene power-mill system of claim 11, further comprising:
    a second graphene sheet configured for generating electrical charges on both sides thereof;
    a second graphene sheet holder configured for engaging and holding the second graphene sheet on a first side thereof, wherein the second graphene sheet holder comprises insulator;
    a second groove provided on the first side of the second graphene sheet holder; and
    a second graphene pusher or bender configured for pushing and releasing a portion of the second graphene sheet into the second groove,
    wherein the second graphene pusher or bender has a shape fitting the second groove,
    wherein the second graphene sheet recovers to be flat after removing the second graphene pusher or bender from the second groove.

13. The graphene power-mill system of claim 12, wherein the second graphene sheet is disposed so as to face the graphene sheet.

14. The graphene power-mill system of claim 13, wherein the second graphene pusher or bender is aligned with the graphene pusher or bender, and wherein the graphene pusher or bender and the second graphene pusher or bender are connected to a driver installed such that each graphene pusher or bender is aligned with corresponding groove in pushing and releasing, wherein the groove has a V shape and the second groove has a U shape.

15. The graphene power-mill system of claim 14, wherein each graphene sheet is attached to corresponding graphene sheet holder such that a portion above corresponding groove is pushed in and released from the groove freely.

16. The graphene power-mill system of claim 1, wherein the graphene pusher or graphene bender is connected to a cover sheet disposed over the graphene sheet, such that the cover sheet is configured to be trodden on by feet or run over by automobiles.

* * * * *